United States Patent
Grodzki

(10) Patent No.: US 10,254,366 B2
(45) Date of Patent: Apr. 9, 2019

(54) METHOD AND MAGNETIC RESONANCE APPARATUS FOR DETERMINING A PULSE SEQUENCE

(71) Applicant: Siemens Aktiengesellschaft, Munich (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 972 days.

(21) Appl. No.: 14/622,116

(22) Filed: Feb. 13, 2015

(65) Prior Publication Data
US 2015/0241535 A1 Aug. 27, 2015

(30) Foreign Application Priority Data
Feb. 13, 2014 (DE) .................. 10 2014 202 649

(51) Int. Cl.
*G01R 33/44* (2006.01)
*G01R 33/54* (2006.01)
G01R 33/48 (2006.01)
G01R 33/56 (2006.01)

(52) U.S. Cl.
CPC ........ *G01R 33/543* (2013.01); *G01R 33/4818* (2013.01); *G01R 33/4828* (2013.01); *G01R 33/5602* (2013.01); *G01R 33/5607* (2013.01)

(58) Field of Classification Search
CPC ............ G01R 33/5608; G01R 33/4835; G01R 33/5611; G01R 33/543; G01R 33/4828
USPC ......................................... 324/309
See application file for complete search history.

(56) References Cited

U.S. PATENT DOCUMENTS

| | | | |
|---|---|---|---|
| 5,608,321 A | 3/1997 | Garroway et al. | |
| 6,150,179 A * | 11/2000 | Went | C07K 1/00 436/173 |
| 8,194,937 B2 * | 6/2012 | Chen | G06T 11/006 382/118 |
| 8,386,013 B2 * | 2/2013 | Du | G01R 33/4824 324/307 |
| 9,141,823 B2 * | 9/2015 | Dawson | G06F 21/6227 |
| 9,197,385 B2 * | 11/2015 | Khoshnevis | H04L 5/0048 |

(Continued)

OTHER PUBLICATIONS

Ma, Dan, et al. "Magnetic resonance fingerprinting." Nature 495. 7440 (2013): 187.*

(Continued)

*Primary Examiner* — Christopher P McAndrew
(74) *Attorney, Agent, or Firm* — Schiff Hardin LLP

(57) ABSTRACT

In a method for determining a pulse sequence composed of multiple consecutive pulse sequence segments and multiple pre-pulses, the number of consecutive pulse sequence segments between two pre-pulses is determined on the basis of a randomizing algorithm. A pulse sequence determining device determines a pulse sequence for a magnetic resonance installation, device having an input interface for entering control protocol parameter values, a pulse sequence determining unit for determining the pulse sequence on the basis of the control protocol that has been entered, and a pre-pulse arrangement unit, which establishes the position of the pre-pulses between the pulse sequence segments in a randomly distributed manner.

22 Claims, 2 Drawing Sheets

(56) References Cited

U.S. PATENT DOCUMENTS

| | | | |
|---|---|---|---|
| 2006/0273791 A1* | 12/2006 | Beck | G01R 33/561 |
| | | | 324/309 |
| 2008/0044074 A1* | 2/2008 | Jerebko | G06T 7/12 |
| | | | 382/128 |
| 2008/0309339 A1* | 12/2008 | Chisholm | G01N 24/087 |
| | | | 324/315 |
| 2009/0274356 A1* | 11/2009 | Ying | G01R 33/561 |
| | | | 382/131 |
| 2011/0274141 A1* | 11/2011 | Jantunen | H04B 1/7183 |
| | | | 375/138 |
| 2013/0101198 A1* | 4/2013 | Grodzki | G01R 33/4816 |
| | | | 382/131 |
| 2014/0232397 A1 | 8/2014 | Grodzki et al. | |

OTHER PUBLICATIONS

Ma et. al,.: Magnetic Resonance Fingerprinting, Nature, vol. 495, (2013) pp. 187-192.

Kyburz, "VNMR Pulse Sequences, Programming and Hardware Aspects," Varian Pub. No. 01-999014-00, Rev.A0398, pp. 110, 147 (1996).

Grodzki et. al.; "Ultrashort Echo Time Imaging Using Pointwise Encoding Time Reduction With Radial Acquisition (PETRA)," Magnetic Resonance in Medicine, vol. 67; (2012) pp. 510-518.

* cited by examiner

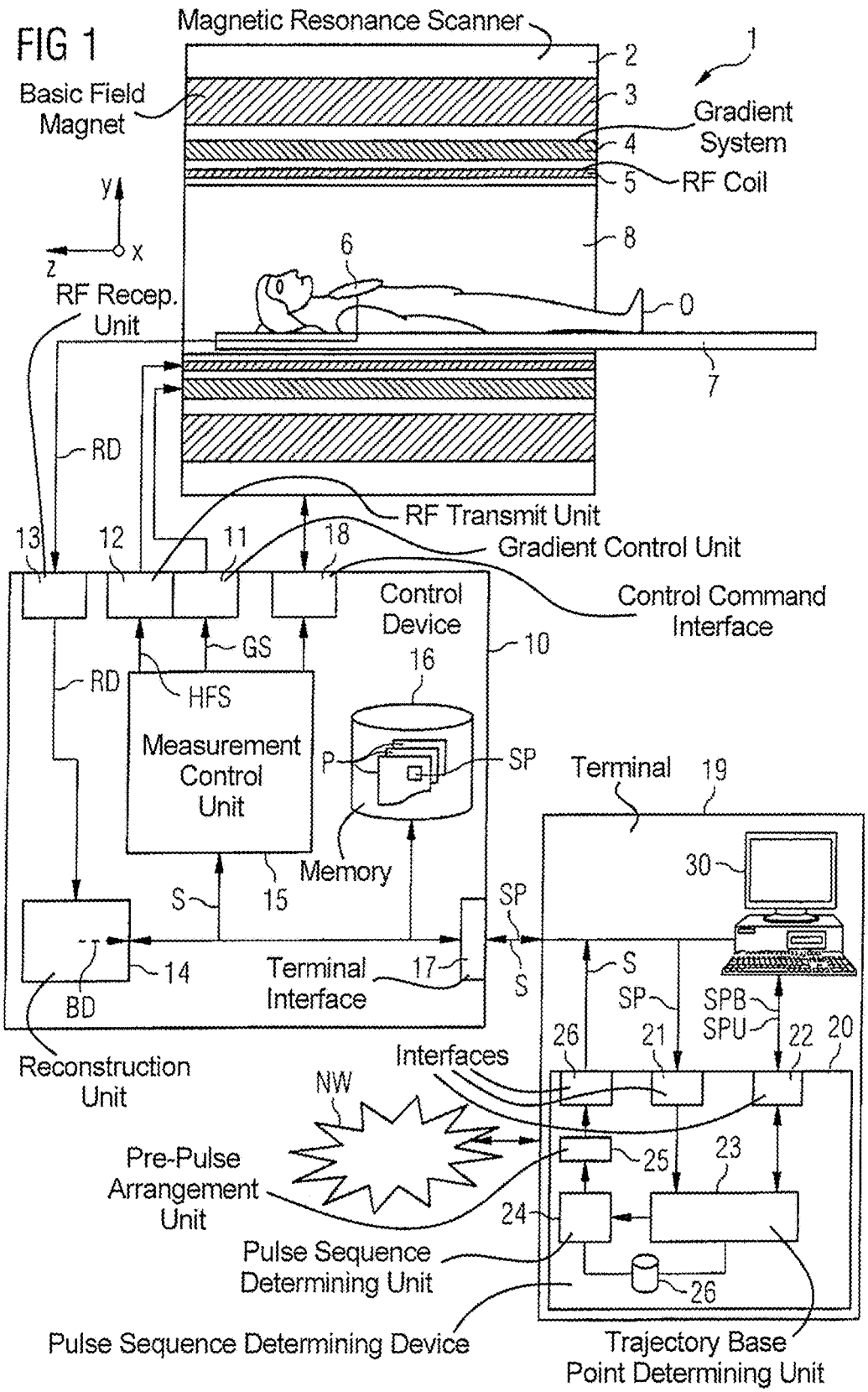

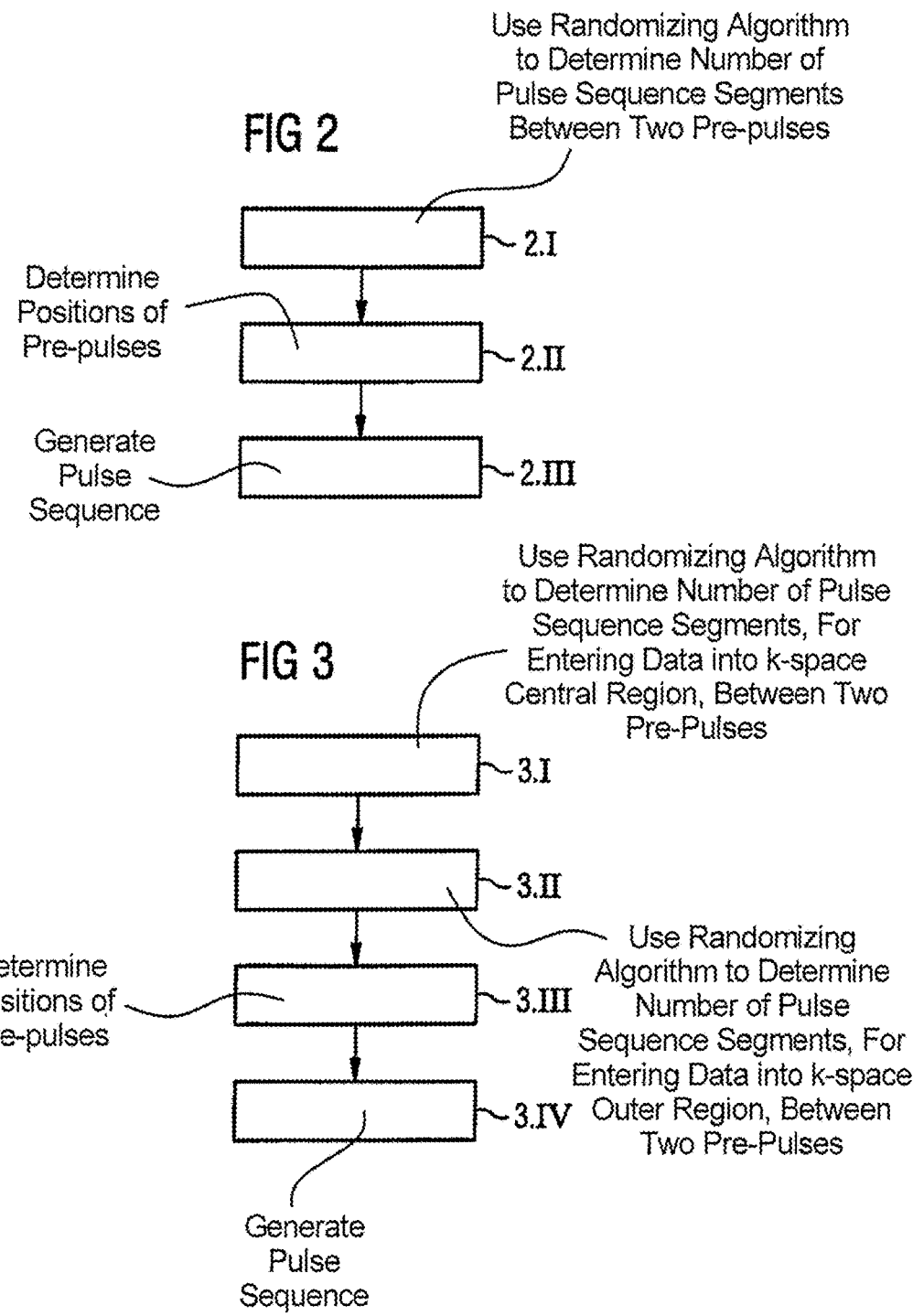

METHOD AND MAGNETIC RESONANCE APPARATUS FOR DETERMINING A PULSE SEQUENCE

BACKGROUND OF THE INVENTION

Field of the Invention

The invention relates to a method for determining a pulse sequence composed of multiple consecutive pulse sequence segments and a plurality of pre-pulses. The invention further relates to a method for operating a magnetic resonance installation. The invention also relates to a magnetic resonance installation that is designed to operate in accordance with such a method.

Description of the Prior Art

Within the MR scanner of a magnetic resonance installation, also known as a magnetic resonance tomography system, the body under examination is usually exposed to a relatively high basic magnetic field of e.g. 1, 3, 5 or 7 Tesla with the use of a basic field magnetic system. In addition, a magnetic field gradient is applied by a gradient system. High-frequency excitation signals (RF signals) are then transmitted via a radio-frequency transmit system by suitable antenna devices, in order to tip (deflect) the nuclear spin of specific atoms, which are resonantly excited by this radio-frequency field, by a defined flip angle relative to the magnetic field lines of the basic magnetic field. The relaxation of the nuclear spin is accompanied by an emission of radio-frequency signals, so-called magnetic resonance signals, which are received by suitable receive antennas and then processed further. The desired image data can then be reconstructed from the raw data acquired thus.

In order to perform a specific measurement (data acquisition), it is necessary to transmit a pulse sequence that include a radio-frequency pulse train and a gradient pulse train (with suitable gradient pulses in a slice selection direction, a phase coding direction and a readout direction, often in the x-direction, y-direction and z-direction of a Cartesian coordinate system) which must be switched (activated) in a coordinated manner. For the purpose of imaging, the timing within the sequence is particularly important, i.e. which pulses are consecutive and what time separations apply. A multiplicity of control parameter values is usually defined in a so-called measurement protocol, which is created in advance and can be retrieved for a specific measurement from a memory, for example, and can, if necessary, be modified locally by the operator, who can specify additional control parameter values such as e.g. a specific slice separation in a stack of slices to be measured, a slice thickness, etc. All of these control parameter values are then used as a basis for calculating a pulse sequence, which is also referred to as a measurement sequence, "MR sequence" (magnetic resonance sequence) or simply "sequence". The pulse sequence is divided into pulse sequence segments, each of which has an excitation function and a readout function, these being assigned an excitation RF pulse and a readout signal, respectively, and having a time duration or period, also referred to as repetition time TR.

The readout functions for the magnetic resonance signals, i.e. the acquisition of raw data, are defined by data entry points in a memory organized as "k-space", and this applies as well to the transmission of the radio-frequency signals. Any desired point in k-space can be accessed by switching the gradients in the various directions as appropriate. K-space is the spatial frequency domain, and a path of data entry in k-space (also referred to as a "k-space trajectory" or simply "trajectory" in the following) describes the route that is taken relative to time through k-space, when transmitting an RF pulse or performing a readout, as a result of corresponding switching of the gradient pulses. K-space is filled with raw data during a magnetic resonance measurement by scanning specific k-space trajectories during the raw data acquisition, and the image data is then reconstructed from this raw data by means of a Fourier transformation.

Various models can be used in order to fill k-space, e.g. Cartesian models in which individual sections of k-space trajectory are scanned on a line-by-line basis, for example, or possibly radial or spiral models. This depends inter alia on the respective sequence type.

Such pulse sequences are usually created by special sequence programmers. This creation is based on the precise definition and implementation of the individual gradient courses in this case, the precise timing and the shape and strength of the individual gradient pulses being specified by the sequence programmer according to the sequence type. Until now, the programming of the sequence has been closely linked to the hardware in this case, i.e. dependent on the respective type of magnetic resonance installation on which the MR sequence is to run.

MR sequences generally cause significant vibrations in the apparatus, and these vibrations are associated with loud noises. Depending on the type of scanner and protocol, noise levels considerably higher than 100 dB(A) can quickly be reached. The main cause of the noise is the rapid switching of the imaging gradients. Specifically, the magnetic fields of the imaging gradients are increased up to a maximal value within a very short time. Since the time specifications within a pulse sequence are generally very strict and the total duration of a pulse sequence, which determines the total duration of an MRT examination, must also be kept as short as possible, it is sometimes necessary to achieve gradient strengths of approximately 40 mT/m and slew rates of up to 200 mT/m/ms. In particular, such a pronounced steepness of the edge contributes to the known noise phenomena during the switching of the gradients. Eddy currents with other components of the magnetic resonance tomography apparatus, in particular the radio-frequency shield, are one reason for these nuisance noises. The rapidly changing magnetic field causes eddy currents in the structural elements of the apparatus, which can result in forces of attraction or repulsion. This results in minimal distortions and vibrations of the gradient coils, which are transferred to the overall system and are audible as loud noises.

Specific sequences such as the PETRA sequence (Grodzki et. al, MRM 2012) are characterized by extremely slow switching or slew rates of the gradient pulses. The resulting distortions and vibrations of the structural elements, e.g. the coils, are so small that they do not cause any noise to develop, and the measurement can be completely silent in principle. However, the obtained image contrast can be selectively modified further by means of so-called preparation pulses, also referred to as pre-pulses. These preparation pulses include e.g. preparation pulses for the suppression of fat and/or water, or T1 or T2 preparation pulses. Such preparation pulses are radiated into the examination object during the recording of the measured data, before or in combination with the RF excitation pulses that are used in the sequences. If e.g. a contrast is required in the PETRA sequence which necessitates the use of pre-pulses or preparation pulses, e.g. fat saturation pulses, the sequence is no longer silent. The reason for this is that in order to emit the pre-pulse, which usually occurs every n=5-25 repetitions, the gradients must be brought down, spoilers connected and the gradients brought up again. This means that gradients having a higher slew rate occur in the case of PETRA protocols with pre-pulses. This can be noticed in a very low-frequency rumbling/clanking of the scanner, such that the measurement is no longer silent. In the case of a repetition time of e.g. TR=4 ms and a number n=20 of repetitions after which a pre-pulse is generated, the frequency of the noises is e.g. 12.5 Hz. This results in a vibration and clanking of large components, since vibrations outweigh noises in this frequency range. Other sequences having limited gradient movement, to which the above cited problem applies, include, e.g., the silent sequences from the group of zero-TE sequences and the SWIFT sequence (SWIFT=Sweep Imaging with Fourier Transform).

This low-frequency vibration, which can be perceived by the patient as shaking, not only causes noise to develop, but can also result in the affected scanner components working loose or becoming detached.

SUMMARY OF THE INVENTION

An object of the present invention is to provide a method for determining a pulse sequence for a magnetic resonance installation and a pulse sequence determining device that is suitable for this purpose, that allow pulse sequences with lower vibrations to be generated.

According to the invention, the number of consecutive pulse sequence segments between two pre-pulses is determined on the basis of a randomizing algorithm.

The pre-pulses can be, e.g., fat saturation pulses for the suppression of fat, or general preparation pulses such as, e.g. preparation pulses for the suppression of water, or T1 or T2 preparation pulses.

With the inventive method, it is possible to widen the frequency range of the vibrations by applying a random distribution to the separation of n pulse sequence segments between the pre-pulses. It is thus possible to prevent the occurrence of resonance effects and to reduce the exposure of patient and MR scanner to vibration and noise.

The inventive pulse sequence determining device for determining a pulse sequence for a magnetic resonance installation has a pre-pulse arrangement unit which is so configured as to establish the position of the pre-pulses between the pulse sequence segments in a randomly distributed manner.

According to the inventive method for operating a magnetic resonance installation, a pulse sequence is determined in accordance with the above-cited method and the magnetic resonance installation is then operated using this pulse sequence.

The inventive pulse sequence has multiple consecutive pulse sequence segments and multiple pre-pulses that are arranged randomly between the pulse sequence segments.

The inventive magnetic resonance installation includes the inventive pulse sequence determining device, this being so configured as to determine a pulse sequence and to transfer this pulse sequence to the control device of the installation.

The inventive computer program, which can be loaded directly into a memory of a pulse sequence determining device, has segments of program code for executing all the steps of the inventive method when the program is executed in the pulse sequence determining device.

According to an embodiment of the method, for the purpose of determining the number of consecutive pulse sequence segments between two pre-pulses, a mean value for the number of consecutive pulse sequence segments between two pre-pulses and a maximal deviation therefrom are established in advance.

For example, the statistical distribution of the determined number of pulse sequence segments between two pre-pulses can be a normal distribution. Furthermore, the distribution can also be any other desired random distribution with a maximum using the established mean value.

Alternatively, for the purpose of determining the number of consecutive pulse sequence segments between two pre-pulses, an interval can also be established in advance. In this case, the statistical distribution for the number of consecutive pulse sequence segments between two pre-pulses can be a uniform distribution. However, the statistical distribution can be any other desired distribution.

The user can therefore specify a range for the number of consecutive pulse sequence segments between two pre-pulses or a mean value and a permissible deviation. After each saturation pulse, a randomizing algorithm determines the number of repetitions until the next saturation pulse. Therefore, having established a mean value n and a maximal deviation dn, for example, not just the frequency $$f = \frac{1}{TR \cdot n}$$

but the frequency range $$f = \frac{1}{TR \cdot (n \pm dn)}$$

will be excited by the magnetic fields or eddy currents generated by the pulse sequence. It is thus possible to prevent the occurrence of resonances or the buildup of shaking.

It is typically necessary to place a pre-pulse, e.g. a fat saturation pulse, every 5 to 25 repetitions or pulse sequence segments. For example, the mean value can be in the range of 10 to 20 and the deviation in range of 1 to 8. This still ensures that the pre-pulses are always placed sufficiently often (there would be 28 repetitions between two pre-pulses in the least favorable case), while nonetheless also ensuring a sufficiently wide bandwidth of the vibration frequencies.

The mean value is most preferably 15, for example, and the deviation 5.

If an interval is specified for the range of the number n of pulse sequence segments between two pre-pulses, the lower boundary value of the interval is preferably between 5 and 15 and the upper boundary value of the interval is preferably between 15 and 25, for example, the interval most preferably in a range of 10 to 20.

According to an embodiment of the method, the mean value for the sampling of the region around the k-space center can have a lower value than the mean value for the sampling of the region in the outer (peripheral) region of k-space. Moreover, the upper boundary value of the interval for the sampling of the region around the center of k-space can have a lower value than the lower or upper boundary value of the interval for the sampling of the region in the space outer region of k-space.

Alternatively, the deviation for the sampling of the region around the center of k-space can have a lower value than the deviation for the sampling of the region in the outer region of k-space.

The distribution of the random numbers can therefore be narrower for a region around the k-space center. The k-space center is therefore saturated either more intensely or very accurately. This means that either do or n is smaller in the k-space center than in the k-space outer region. The particulars of a recorded structure are usually encoded in the k-space center, and therefore it can be beneficial to reduce the time separations, in which e.g. fat saturation pulses are placed, in this region or at least to ensure that the fat saturation pulses are placed at comparatively regular separations, in order to achieve a particularly high imaging quality of the fine structures or a particularly good contrast.

According to an aspect of the invention, a PETRA sequence can be used as a pulse sequence. This is characterized by particularly low noise. However, the aforementioned shaking does occur in the case of precisely this pulse sequence when pre-pulses are used. If the described method is applied, the low noise level which is typical of the PETRA sequence can be preserved. For example, a silent sequence from the group of zero-TE sequences or a SWIFT sequence or another particularly low-noise sequence can also be used as a pulse sequence.

In initial trials, the method proposed here shows little or no effect on the image or the saturation. As a result of the random distribution of the saturations in the specified region, there are no symmetries in k-space which could be interpreted as artifacts in the image.

BRIEF DESCRIPTION OF THE DRAWINGS

FIG. 1 is a schematic illustration of an exemplary embodiment of a magnetic resonance installation, having a pulse sequence determining device according to the invention.

FIG. 2 is a flowchart that illustrates a first exemplary embodiment of the method according to the invention.

FIG. 3 is a flowchart that illustrates a second exemplary embodiment of the method according to the invention.

DESCRIPTION OF THE PREFERRED EMBODIMENTS

FIG. 1 provides a basic schematic illustration of a magnetic resonance installation 1 according to the invention. This installation includes the actual magnetic resonance scanner 2 that has an examination volume or patient tunnel 8 therein. A bed 7 can be moved into this patient tunnel 8, such that during an examination a patient O or subject lying thereon can be supported at a specific position within the magnetic resonance scanner 2 relative to the magnetic system and radio-frequency system that is arranged therein, and can also be moved between various positions during a measurement.

Basic components of the magnetic resonance scanner 2 include a basic field magnet 3, a gradient system 4 with magnetic field gradient coils for generating magnetic field gradients in the x-direction, y-direction and z-direction, and a whole-body radio-frequency coil 5. The magnetic field gradient coils in the x-direction, y-direction and z-direction can be activated independently of each other, such that by a specific combination thereof, gradients can be applied in any desired logical spatial directions, e.g. in a slice selection direction, a phase coding direction, or a readout direction. These directions generally depend on the selected slice orientation. The magnetic resonance signals that are induced in the examination object O can be received via the whole-body coil 5, which is usually also used to transmit the radio-frequency signals that induce the magnetic resonance signals. However, these signals are usually received by means of a local coil arrangement 6 composed of local coils (only one of which is illustrated here) which are placed, e.g., on or under the patient O. All of these components are known to those skilled in the art, and are therefore need only be illustrated in a schematic manner in FIG. 1.

The components of the magnetic resonance scanner 2 can be activated by a control device 10. The control device 10 may be a control computer, possibly composed of multiple individual computers that can be physically separate and interconnected via suitable cables, etc. This control device 10 is connected via a terminal interface 17 to a terminal 19, through which an operator can activate the overall installation 1. In the present case, this terminal 19 takes the form of a computer with a keyboard, one or more display screens, and further input devices such as, e.g., a mouse or the like, such that a graphical user interface is available to the operator.

The control device 10 has inter alia a gradient control unit 11, which may be composed of multiple subcomponents. This gradient control unit 11 is used to operate the individual gradient coils by control signals in accordance with a gradient pulse sequence GS. As described above, during a measurement (data acquisition), these gradient pulses are placed at precisely designated temporal positions using a precisely specified temporal course.

The control device 10 also has a radio-frequency transmit unit 12 for the purpose of supplying the whole-body radio-frequency (RF) coil 5 with radio-frequency pulses in accordance with a specified radio-frequency pulse sequence RFS of the pulse sequence S. The radio-frequency pulse sequence RFS includes excitation pulses and refocusing pulses. The magnetic resonance signals are received by means of the local coil arrangement 6, and the raw data RD received therefrom is read out and processed by an RF reception unit 13. The magnetic resonance signals are transferred in digital form as raw data RD to a reconstruction unit 14, which reconstructs the image data BD therefrom and stores this in a memory 16 and/or transfers it via the interface 17 to the terminal 20 in order that the operator can view it. The image data BD can also be stored and/or displayed and analyzed at other locations via a network NW. Alternatively, a radio-frequency pulse sequence can also be transmitted via the local coil arrangement and/or the magnetic resonance signals can be received by the whole-body radio-frequency coil (not shown).

A further interface 18 is used to transfer control commands to other components of the magnetic resonance scanner 2, e.g. the bed 7 or the basic field magnet 3, or receive measured values or other information.

The gradient control unit 11, the RF transmit unit 12 and the RF reception unit 13 are each activated in a coordinated manner by a measurement control unit 15. This uses corresponding commands to ensure that the desired gradient pulse sequence GS (i.e. the series of gradient pulses) and radio-frequency pulse sequence RFS of the pulse sequence are transmitted. It is also necessary to ensure that the magnetic resonance signals at the local coils of the local coil arrangement 6 are read out and processed at the appropriate point in time by the RF reception unit 13, i.e. readout windows must be set by switching the ADCs of the RF reception unit 13 to receive, for example. The measurement control unit 15 also activates the interface 18.

The basic routine for such a magnetic resonance measurement and the cited components for activation are however known to those skilled in the art, and are therefore not discussed further in detail here. Moreover, such a magnetic resonance scanner 2 and the associated control device may have a number of further components, which are likewise not explained in detail herein. It should be noted that the magnetic resonance scanner 2 may also be structured differently, e.g. having a patient space which is open at the side, or as a smaller scanner which can accommodate only part of a body.

In order to start a measurement, an operator usually selects a control protocol P that is intended for this measurement from a memory 16 via the terminal 19, wherein the memory 16 contains a multiplicity of control protocols P for different measurements. This control protocol P contains inter alia various control protocol parameter values SP for the respective measurement. These control protocol parameter values SP include e.g. the sequence type, the magnetization to be achieved by the individual radio-frequency pulses, layer thicknesses, layer separations, resolution, number of layers, echo times, repetition times, etc.

In addition, the operator can retrieve control protocols containing corresponding control protocol parameter values SP via a network NW instead of from the memory 16, e.g. from a manufacturer of the magnetic resonance installation, and then use these as described below.

The control protocol parameter values SP including the selected time parameters are then used as a basis for determining a pulse sequence S according to which the measurement control unit 15 finally activates the remaining components. The pulse sequence S here is calculated in a pulse sequence determining device 20, which is shown as part of the terminal 19.

Specifically, the pulse sequence determining device 20 has an input interface arrangement 21 via which e.g. control protocol parameter values SP can be entered. A pulse sequence determining unit 24 determines the pulse sequence S on the basis of the control protocol that has been entered. A pre-pulse arrangement unit 25 establishes the position of the pre-pulses between the pulse sequence segments in accordance with the inventive method. The pulse sequence S can then be emitted as an output via a pulse sequence interface 26, for example.

The pulse sequence determining device 20 may have a trajectory base point determining unit 23 for determining k-space trajectory base points within k-space on the basis of the control protocol parameter values SP. In this case, the pulse sequence determining unit 24 is so configured as to determine the pulse sequence S on the basis of the k-space trajectory base points.

The transfer of the possible parameter ranges SPB that can be set, and the receipt of the parameter value change commands SPU, can be effected via an interface 22 of the pulse sequence determining device 20, for example.

FIG. 2 shows a flowchart of an exemplary routine according to an embodiment of the inventive method for determining a pulse sequence.

Using the method shown here, a pulse sequence is generated which has multiple consecutive pulse sequence segments and multiple pre-pulses. The pulse sequence that is generated can be a PETRA sequence, for example, this sequence being characterized by particularly low noise.

In a first step 2.I, the number of consecutive pulse sequence segments between two pre-pulses is determined on the basis of a randomizing algorithm. In a second step 2.II, the positions of the pre-pulses between the pulse sequence segments are established according to the random distribution that has been determined. In a third step 2.III, a pulse sequence is generated comprising pre-pulses at the previously established positions between the pulse sequence segments.

The method described herein therefore compensates for the disadvantages of using saturation pulses, in respect of the development of noise and vibration in a magnetic resonance installation, by selecting a random separation between saturation pulses in a specified range, with a specified deviation relative to a specified mean value.

FIG. 3 shows a flowchart of a second embodiment of the method according to the invention. In this case, either the distribution or the separation of the pre-pulses or preparation pulses is so selected as to be narrower. This means that either do or n in the k-space center is smaller than in the k-space outer region. The k-space center is therefore saturated either more intensely or very accurately. The particulars of a recorded structure are usually encoded in the k-space center, and therefore it can be beneficial to reduce the time separations in which pre-pulses are placed in this region or at least to ensure that the pre-pulses are placed at comparatively regular separations, in order to achieve a particularly high imaging quality of the fine structures or a particularly good contrast.

In a first step 3.I of this method, the number of consecutive pulse sequence segments between two pre-pulses is determined on the basis of a randomizing algorithm in the k-space center. In a second step 3.II, the number of consecutive pulse sequence segments between two pre-pulses is determined on the basis of a randomizing algorithm in the k-space outer region. In a third step 3.III, the positions of the pre-pulses between the pulse sequence segments are established according to the random distribution that has been determined. In a fourth step 3.IV, a pulse sequence is generated comprising pre-pulses at the previously established positions between the pulse sequence segments.

Use of the method according to the invention results in the advantages that the low-frequency vibration frequency peak is widened, the resonance is broken, the sequence becomes more pleasant for the patient because the spectrum of noise and shaking is widened, and the components of the MR scanner are less stressed by the low-frequency shaking.

It should be noted that the features of all exemplary embodiments or developments disclosed in the figures can be used in any desired combination.

In conclusion, it is again noted that the detailed methods and designs described above relate to exemplary embodiments, and that the underlying principle may also be varied extensively by a person skilled in the art without thereby departing from the scope of the invention as specified by the claims. For example, the pulse sequence determining device 20 can also be realized as part of the control device 10 itself, in particular as a component of the measurement control unit 15, instead of on the terminal. Likewise, the pulse sequence determining device 20 could also be realized on a separate processing system which is connected to the magnetic resonance installation 1 via the network NW, for example.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining a pulse sequence for operating a magnetic resonance apparatus, said method comprising:

in a computer, accessing a randomizing algorithm;

in said computer, configuring a pulse sequence for operating a magnetic resonance apparatus that is executed in a plurality of repetitions of said pulse sequence, said pulse sequence comprising a plurality of consecutive pulse sequence segments and a plurality of pre-pulses that are radiated with a number of said pulse sequence segments therebetween, by determining, with said randomizing algorithm, a random number of said consecutive pulse sequence segments that occur between two successive pre-pulses in said repetitions of said pulse sequence; and making said pulse sequence with said number of consecutive pulse sequence segments between said two pre-pulses determined by said randomizing algorithm, available at an output of said computer in an electronic form that allows said pulse sequence to be used to operate said magnetic resonance apparatus.

2. A method as claimed in claim 1 comprising, before determining said number of consecutive pulse sequence segments using said randomizing algorithm between said pre-pulses, determining a mean value of said number of consecutive pulse sequence segments between said two successive pre-pulses, and establishing a maximum permissible deviation from said mean value, and requiring said number of consecutive pulse sequence segments determined by said randomizing algorithm between said two pre-pulses not to exceed said maximal deviation.

3. A method as claimed in claim 2 comprising, prior to determining said number of consecutive pulses sequence segments using said randomizing algorithm between said two successive pre-pulses, determining an interval for said number of consecutive pulse sequence segments occurring between said two successive pre-pulses.

4. A method as claimed in claim 3 comprising setting said interval to be in a range of said number of consecutive pulse sequence segments between 10 and 20 and said maximal deviation to be in a range of said number of consecutive pulse sequence segments between 1 and 8, and setting a lower boundary of said interval to be in a range of said number of consecutive pulse sequence segments between 5 and 10 and an upper boundary of said interval to be in a range of said number of consecutive pulse sequence segments between 15 and 25.

5. A method as claimed in claim 4 comprising setting said mean value to be 15 and said maximal deviation to be 5 and setting a lower boundary value of said interval to be 10 and an upper boundary value of said interval to be 20.

6. A method as claimed in claim 3 wherein magnetic resonance data acquired by said magnetic resonance apparatus upon execution of said pulse sequence are entered into k-space in a memory organized as k-space, and wherein k-space has a k-space center and a central region around said k-space center and an outer region around said central region, and wherein said consecutive pulse sequence segments comprise pulse sequence segments that cause magnetic resonance data to be entered into said central region of k-space and pulse sequence segments that cause magnetic resonance data to be entered into said outer region of k-space, and wherein said method comprises setting said mean value for said consecutive pulse sequence segments for which MR data are entered into said central region of k-space to be lower than said mean value for said pulse sequence segments that cause magnetic resonance data to be entered into said outer region of k-space, and setting an upper boundary value of said interval for said pulse sequence segments that cause magnetic resonance data to be entered into said central region of k-space to be lower than either a lower boundary value or an upper boundary value of said interval for said pulse sequence segments that cause said magnetic resonance data to be entered into said outer region of k-space.

7. A method as claimed in claim 6 comprising setting said deviation for said pulse sequence segments that cause magnetic resonance data to be entered into said central region of k-space to be lower than the deviation for said pulse sequence segments that cause magnetic resonance data to be entered into said outer region of k-space.

8. A method as claimed in claim 2 comprising setting said mean value to be in a range between 10 and 20 and said maximal deviation to be in a range between 1 and 8.

9. A method as claimed in claim 2 comprising setting said mean value to be 15 and said maximal deviation to be 5.

10. A method as claimed in claim 2 wherein magnetic resonance data acquired by said magnetic resonance apparatus upon execution of said pulse sequence are entered into k-space in a memory organized as k-space, and wherein k-space has a k-space center and a central region around said k-space center and an outer region around said central region, and wherein said consecutive pulse sequence segments comprise pulse sequence segments that cause magnetic resonance data to be entered into said central region of k-space and pulse sequence segments that cause magnetic resonance data to be entered into said outer region of k-space, and wherein said method comprises setting said mean value for said consecutive pulse sequence segments for which MR data are entered into said central region of k-space to be lower than said mean value for said pulse sequence segments that cause magnetic resonance data to be entered into said outer region of k-space.

11. A method as claimed in claim 10 comprising setting said deviation for said pulse sequence segments that cause magnetic resonance data to be entered into said central region of k-space to be lower than the deviation for said pulse sequence segments that cause magnetic resonance data to be entered into said outer region of k-space.

12. A method as claimed in claim 1 comprising, prior to determining said number of consecutive pulses sequence segments using said randomizing algorithm between said two successive pre-pulses, determining an interval for said number of consecutive pulse sequence segments occurring between said two pre-pulses.

13. A method as claimed in claim 12 comprising setting a lower boundary of said interval to be in a range of said number of consecutive pulse sequence segments between 5 and 10 and an upper boundary of said interval to be between 15 and 25.

14. A method as claimed in claim 12 comprising setting a lower boundary value of said interval to be 10 and an upper boundary value of said interval to be 20.

15. A method as claimed in claim 12 wherein magnetic resonance data acquired by said magnetic resonance apparatus upon execution of said pulse sequence are entered into k-space in a memory organized as k-space, and wherein k-space has a k-space center and a central region around said k-space center and an outer region around said central region, and wherein said consecutive pulse sequence segments comprise pulse sequence segments that cause magnetic resonance data to be entered into said central region of k-space and pulse sequence segments that cause magnetic resonance data to be entered into said outer region of k-space, and wherein said method comprises setting an upper boundary value of said interval for said pulse sequence segments that cause magnetic resonance data to be entered into said central region of k-space to be lower than either a lower boundary value or an upper boundary value of said interval for said pulse sequence segments that cause said magnetic resonance data to be entered into said outer region of k-space.

16. A method as claimed in claim 1 comprising configuring said pulse sequence with said pre-pulses being preparation pulses.

17. A method as claimed in claim 16 comprising configuring said pulse sequence with said preparation pulses being saturation pulses.

18. A method as claimed in claim 1 comprising configuring said pulse sequence in said computer as a PETRA sequence.

19. A method for operating a magnetic resonance apparatus comprising:
in a computer, accessing a randomizing algorithm;
in said computer, configuring a pulse sequence for operating a magnetic resonance apparatus that is executed in a plurality of repetitions of said pulse sequence, said pulse sequence comprising a plurality of consecutive pulse sequence segments and a plurality of pre-pulses that are radiated with a number of said pulse sequence segments therebetween, by determining, with said randomizing algorithm, a random number of said consecutive pulse sequence segments that occur between two successive pre-pulses in said repetitions of said pulse sequence; and
from said computer, operating said magnetic resonance apparatus with said pulse sequence with said number of consecutive pulse sequence segments between said two pre-pulses determined by said randomizing algorithm.

20. A pulse sequence determining device for determining a pulse sequence for operating a magnetic resonance apparatus comprising:
an input interface via which control protocol parameter values are entered;
a computer configured to access a randomizing algorithm;
said computer being configured to generate a pulse sequence for operating a magnetic resonance apparatus that is executed in a plurality of repetitions of said pulse sequence, said pulse sequence comprising a plurality of consecutive pulse sequence segments and a plurality of pre-pulses that are radiated with a number of said pulse sequence segments therebetween, including determining, with said randomizing algorithm, a random number of said consecutive pulse sequence segments that occur between two successive pre-pulses in said repetitions of said pulse sequence;
an output interface; and
said computer being configured to make said pulse sequence with said number of consecutive pulse sequence segments between said two pre-pulses determined by said randomizing algorithm, available in said output interface in an electronic form that allows said pulse sequence to be used to operate said magnetic resonance apparatus.

21. A magnetic resonance apparatus comprising:
a magnetic resonance data acquisition unit comprising a radio-frequency transmitting and receiving system and a gradient system:
a computer configured to access a randomizing algorithm;
said computer being configured to generate a pulse sequence for operating the magnetic resonance data acquisition unit that is executed in a plurality of repetitions of said pulse sequence, said pulse sequence comprising a plurality of consecutive pulse sequence segments and a plurality of pre-pulses that are radiated with a number of said pulse sequence segments therebetween, including determining, with said randomizing algorithm, a random number of said consecutive pulse sequence segments that occur between two successive pre-pulses in said repetitions of said pulse sequence; and
said computer being configured to operate said magnetic resonance data acquisition unit with said pulse sequence with said number of consecutive pulse sequence segments between said two pre-pulses determined by said randomizing algorithm.

22. A non-transitory, computer-readable data storage medium encoded with programming instructions, said data storage medium being loaded into a computer of a magnetic resonance apparatus comprising a magnetic resonance data acquisition unit, said programming instructions causing said computer to:
access a randomizing algorithm;
generate a pulse sequence for operating the magnetic resonance apparatus data acquisition unit that is executed in a plurality of repetitions of said pulse sequence, said pulse sequence comprising a plurality of consecutive pulse sequence segments and a plurality of pre-pulses that are radiated with a number of said pulse sequence segments therebetween, by determining, with said randomizing algorithm, a number of said consecutive pulse sequence segments that occur between two successive pre-pulses in said repetitions of said pulse sequence; and
make said pulse sequence with said number of consecutive pulse sequence segments between said two pre-pulses determined by said randomizing algorithm, available at an output of said computer in an electronic form that allows said pulse sequence to be used to operate said magnetic resonance apparatus.

* * * * *